United States Patent
Kumar et al.

(10) Patent No.: US 10,236,055 B1
(45) Date of Patent: Mar. 19, 2019

(54) MEMORY ELEMENT WRITE-ASSIST CIRCUITRY WITH DUMMY BIT LINES

(71) Applicant: Altera Corporation, San Jose, CA (US)

(72) Inventors: Rajiv Kumar, Penang (MY); Kuan Cheng Tang, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/668,842

(22) Filed: Mar. 25, 2015

Related U.S. Application Data

(60) Provisional application No. 62/091,423, filed on Dec. 12, 2014.

(51) Int. Cl.
  *G11C 11/41* (2006.01)
  *G11C 11/419* (2006.01)
  *G11C 5/06* (2006.01)

(52) U.S. Cl.
  CPC .............. *G11C 11/419* (2013.01); *G11C 5/06* (2013.01)

(58) Field of Classification Search
  CPC ................. G11C 7/12; G11C 7/14; G11C 7/18
  See application file for complete search history.

(56) References Cited

U.S. PATENT DOCUMENTS

| | | | |
|---|---|---|---|
| 6,172,925 B1 | 1/2001 | Bloker | |
| 7,248,523 B2 | 7/2007 | Ohtsuki et al. | |
| 7,307,905 B2 | 12/2007 | Najm et al. | |
| 7,376,032 B2 | 5/2008 | Nguyen et al. | |
| 7,382,668 B2* | 6/2008 | Park | G11C 7/18 365/201 |
| 7,916,563 B2 | 3/2011 | Chang | |
| 7,944,458 B2* | 5/2011 | Kwon | G09G 3/2011 345/690 |
| 8,233,340 B1 | 7/2012 | Chingi Chang | |
| 9,030,863 B2* | 5/2015 | Gulati | G11C 11/419 365/154 |
| 9,171,595 B2* | 10/2015 | Fujiwara | G11C 7/12 |
| 2007/0002617 A1* | 1/2007 | Houston | G11C 11/412 365/185.07 |
| 2014/0071735 A1 | 3/2014 | Sridhara et al. | |

* cited by examiner

*Primary Examiner* — Vanthu T Nguyen

(74) *Attorney, Agent, or Firm* — Treyz Law Group, P.C.; Jason Tsai

(57) ABSTRACT

Integrated circuits with memory elements are provided. In particular, a group of random-access memory cells may be coupled to first and second data lines via corresponding access transistors. One of the first and second data lines can be driven to a ground voltage level to write a zero or one into a selected memory cell in the group. A first dummy data line can be formed adjacent to the first data line, whereas a second dummy data line can be formed adjacent to the second data line. During data loading operations, at least one of the dummy data lines can be pulsed to temporarily drive the voltage on the associated data line to below the ground voltage level. Operated in this way, the write operation of the memory cells can be improved.

17 Claims, 6 Drawing Sheets

MEMORY ELEMENT WRITE-ASSIST CIRCUITRY WITH DUMMY BIT LINES

This application claims the benefit of provisional patent application No. 62/091,423 filed Dec. 12, 2014, which is hereby incorporated by reference herein in its entirety.

BACKGROUND

This relates to integrated circuits with memory and, more particularly, to volatile memory elements.

Integrated circuits often contain volatile memory elements. A volatile memory element retains data only so long as the integrated circuit is powered. In the event of power loss, the data in the volatile memory element is lost. Although nonvolatile memory elements such as memory elements based on electrically-erasable programmable read-only memory technology are not subject to data loss in this way, it is often not desirable or possible to fabricate nonvolatile memory elements as part of a given integrated circuit.

As a result, volatile memory elements are often used. For example, static random-access memory (SRAM) chips contain SRAM cells, which are a type of volatile memory element. In programmable logic device integrated circuits, SRAM cells may serve as configuration random access memory (CRAM) cells. Programmable logic devices are a type of integrated circuit that can be programmed by a user to implement a desired custom logic function. CRAM cells are used to store configuration data supplied by the user. Once loaded, CRAM cells supply control signals to transistors to configure the transistors to implement the desired logic function.

Volatile memory elements such as SRAM and CRAM cells are typically based on cross-coupled inverters (latches). In each memory element, the cross-coupled inverters are connected to an address transistor that is turned on when data is being read from or written into the memory element. When no data is being read from or written into the memory element, the address transistor is turned off to isolate the memory element. Cross-coupled inverters and address transistors can be formed from complementary metal-oxide-semiconductor (CMOS) transistors such as re-channel metal-oxide-semiconductor (NMOS) and p-channel metal-oxide-semiconductor (PMOS) transistors.

As semiconductor technology scales towards smaller sizes, lower power supply voltages may be used to power integrated circuits. Lower power supply voltages and smaller devices may lead to decreased read and write margins for volatile memory elements. This can pose challenges for reliable device operation.

DETAILED DESCRIPTION

Embodiments of the present invention relate to integrated circuit memory elements and, in particular, to circuitry for improving the write margin of the memory elements. It will be recognized by one skilled in the art, that the present exemplary embodiments may be practiced without some or all of these specific details. In other instances, well-known operations have not been described in detail in order not to unnecessarily obscure the present embodiments.

The integrated circuit memory elements, which are sometimes referred to as memory cells, may contain any suitable number of transistors. The memory elements can be used in any suitable integrated circuits that use memory. These integrated circuits may be memory chips, digital signal processing circuits with memory arrays, microprocessors, application specific integrated circuits with memory arrays, programmable integrated circuits such as programmable logic device integrated circuits in which memory elements are used for configuration memory, or any other suitable integrated circuit.

On integrated circuits such as memory chips or other circuits in which memory is needed to store processing data, the memory elements can be used to perform the functions of static random-access memory (RAM) cells and are sometimes referred to as SRAM cells. In the context of programmable logic device integrated circuits, the memory elements can be used to store configuration data and are therefore sometimes referred to in this context as configuration random-access memory (CRAM) cells.

Figure 1:
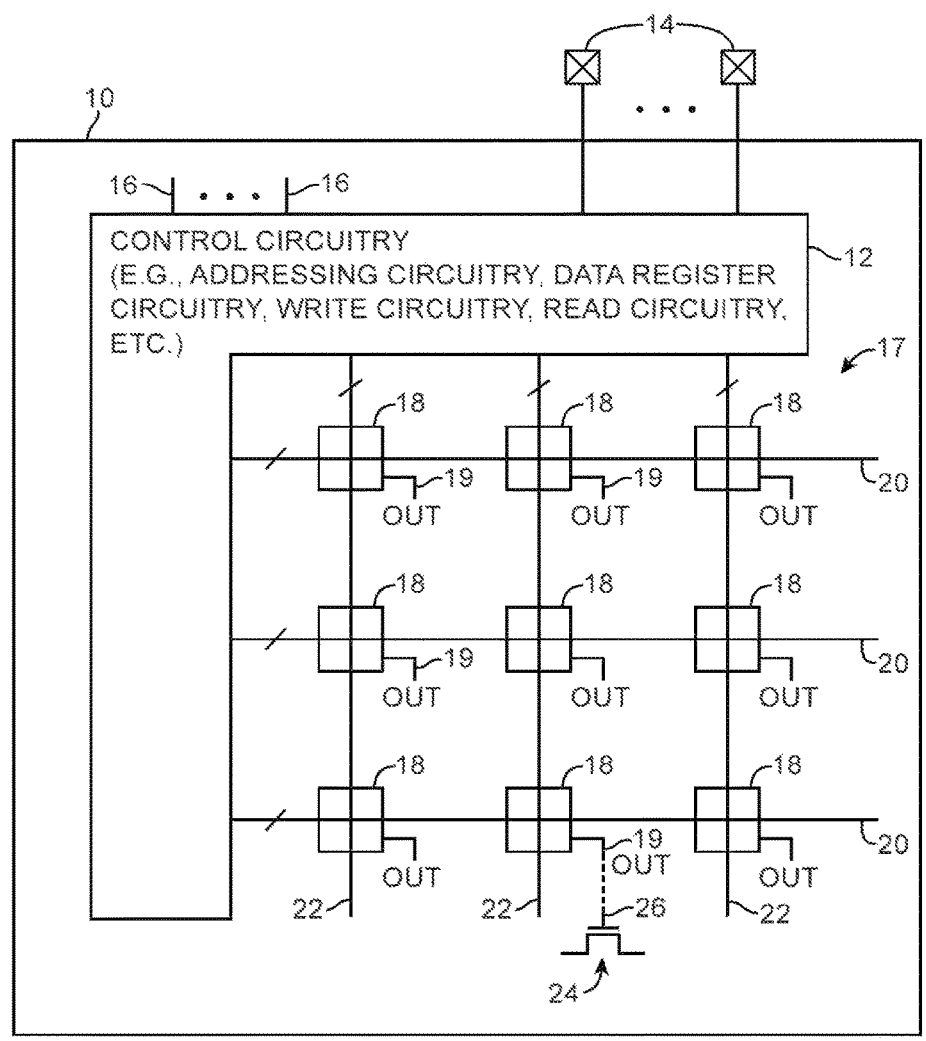
FIG. 1 is a diagram of an illustrative memory element array in accordance with an embodiment.

FIG. 1 shows an integrated circuit that may include an array of memory elements (cells) 18. Any suitable memory array architecture may be used for memory cells 18. One suitable arrangement is shown in FIG. 1. There are only three rows and columns of memory cells 18 in the illustrative array of FIG. 1, but in general there may be hundreds or thousands of rows and columns in memory array 17. Array 17 may be one of a number of arrays on a given device 10, may be a subarray that is part of a larger array, or may be any other suitable group of memory cells 18.

Each memory element 18 may be formed from a number of transistors configured to form a bistable circuit (i.e., a latch-type circuit). True and complement data storage nodes in the bistable circuit element can store corresponding true and complement versions of a data bit.

A bistable circuit element may be based on any suitable number of transistors. For example, the bistable portion of each memory element may be formed from cross-coupled inverters, from groups of multiple inverter-like circuits (e.g., in a distributed configuration that provides enhanced immunity from soft-error-upset events, etc.). Arrangements with bistable elements formed from cross-coupled inverting pairs are sometimes described herein as an example. This is, however, merely illustrative. Memory elements 18 may be formed using any suitable memory cell architecture.

Each memory element may supply a corresponding output signal OUT at a corresponding output path 19. In CRAM arrays, each signal OUT is a static output control signal that may be conveyed over a corresponding path 26 and may be used in configuring a corresponding transistor such as pass transistor 24 or other circuit element in an associated programmable logic circuit.

Integrated circuit 10 may have control circuitry 12 for supplying signals to memory array 17. Control circuitry 12 may receive power supply voltages, data, and other signals from external sources using pins 14 and from internal sources using paths such as paths 16. Control circuitry 12 may include circuitry such as addressing circuitry, data register circuitry, write circuitry, read circuitry, etc. Control circuitry 12 may use the power supply voltages supplied by pins 14 to produce desired time-varying and/or fixed signals on paths such as paths 20 and 22.

There may, in general, be any suitable number of conductive lines associated with paths 20 and 22. For example, each row of array 17 may have associated address lines (e.g., a true address line and a complement address line) and associated read/write enable lines in a respective one of paths 20 (as examples). Each column of array 17 may have a respective path 20 that includes data lines (e.g., a true data line and a complement data line). A clear signal may be routed to all of the cells in array 17 simultaneously over a common clear line. The clear line may be oriented vertically so that there is one branch of the clear line in each path 22 or may be oriented horizontally so that there is one branch of the clear line in each path 20. The clear line need not be necessary.

Power can also be distributed in this type of global fashion. For example, a positive power supply voltage Vcc may be supplied in parallel to each cell 18 using a pattern of shared horizontal or vertical conductors. A ground voltage Vss may likewise be supplied in parallel to cells 18 using a pattern of shared horizontal or vertical lines. Control lines such as address lines and data lines are typically orthogonal to each other (e.g., address lines are vertical while data lines are horizontal or vice versa).

The terms "rows" and "columns" merely represent one way of referring to particular groups of cells 18 in memory array 17 and may sometimes be used interchangeably. If desired, other patterns of lines may be used in paths 20 and 22. For example, different numbers of power supply signals, data signals, and address signals may be used.

The signals that are supplied to memory elements 18 may sometimes be collectively referred to as control signals. In particular contexts, some of these signals may be referred to as power signals, clear signals, data signals, address signals, etc. These different signal types are not mutually exclusive. For example, a clear signal for array 17 may serve as a type of control (address) signal that can be used to clear array 17. This clear signal may also serve as a type of power signal by powering inverter-like circuitry in cells 18. Likewise, because clearing operations serve to place logic zeros in memory cells 18, clear signals may serve as a type of data signal.

Positive power supply voltage Vcc may be provided over a positive power supply line. Ground voltage Vss may be provided over a ground power supply line. Any suitable values may be used for positive power supply voltage Vcc and ground voltage Vss. For example, positive power supply voltage Vcc may be 1.2 volts, 1.1 volts, 1.0 volts, 0.9 volts, 0.8 volts, less than 0.8 volts, or any other suitable voltage. Ground voltage Vss may be zero volts (as an example). In a typical arrangement, power supply voltages Vcc may be 0.8 volts, Vss may be zero volts, and the signal levels for address, data, and clear signals may range from zero volts (when low) to 0.8 volts (when high). Arrangements in which Vcc varies as a function of time, in which Vss is less than zero volts, and in which control signals are overdriven (i.e., in which control signals have signal strengths larger than Vcc-Vss) may also be used.

In conventional SRAM designs, write assist schemes that generate negative data line (often referred to as "bit line") voltages during write operations are used. The negative bit line voltages are typically generated based on use of a transistor-based booster capacitor (i.e., an re-channel or p-channel metal-oxide-semiconductor capacitor). The capacitance provided across the gate oxide layer of a MOS capacitor, however, is unstable across process-temperature-voltage (PVT) variations and can therefore result in device reliability issues.

Consider a scenario in which the target negative bit line voltage that is desired during a write operation is −60 mV. In practice, however, the negative bit line voltage can vary from −25 mV to more than −400 mV due to PVT variations. One way of controlling the amount of variation is by adjusting the size of the MOS capacitor. Typically, larger MOS capacitors exhibit higher variability. However, if the MOS capacitors are too small, the write assist that is provided is not effective. To provide sufficient capacitance for an effective write assist, the MOS capacitors need to be fairly large and can therefore take up a substantial amount of die area (i.e., 10-15% or more).

If the MOS capacitors are too large, device reliability becomes a concern as overly large negative bit lines can cause undesired data corruption in unselected memory cells and can consume excess power. As a result, testing and fuse trimming operations are required during device manufacturing to properly trim the capacitance of the MOS capacitors to the desired value. For example, dies categorized as being in the "faster" process corner should be provided with smaller bit line capacitance, whereas dies categorized as being in the "slower" process corner should be provided with relatively larger bit line capacitance. Such capacitance trimming procedures can be time consuming and can therefore increase test cost. Even reliable voltage range for a MOSFET device operation is a concern as near end and far end memory cells experience substantially different negative voltage due to the RC of the bit lines. This effect is exacerbated as the number of bits per column increases.

Figure 2:
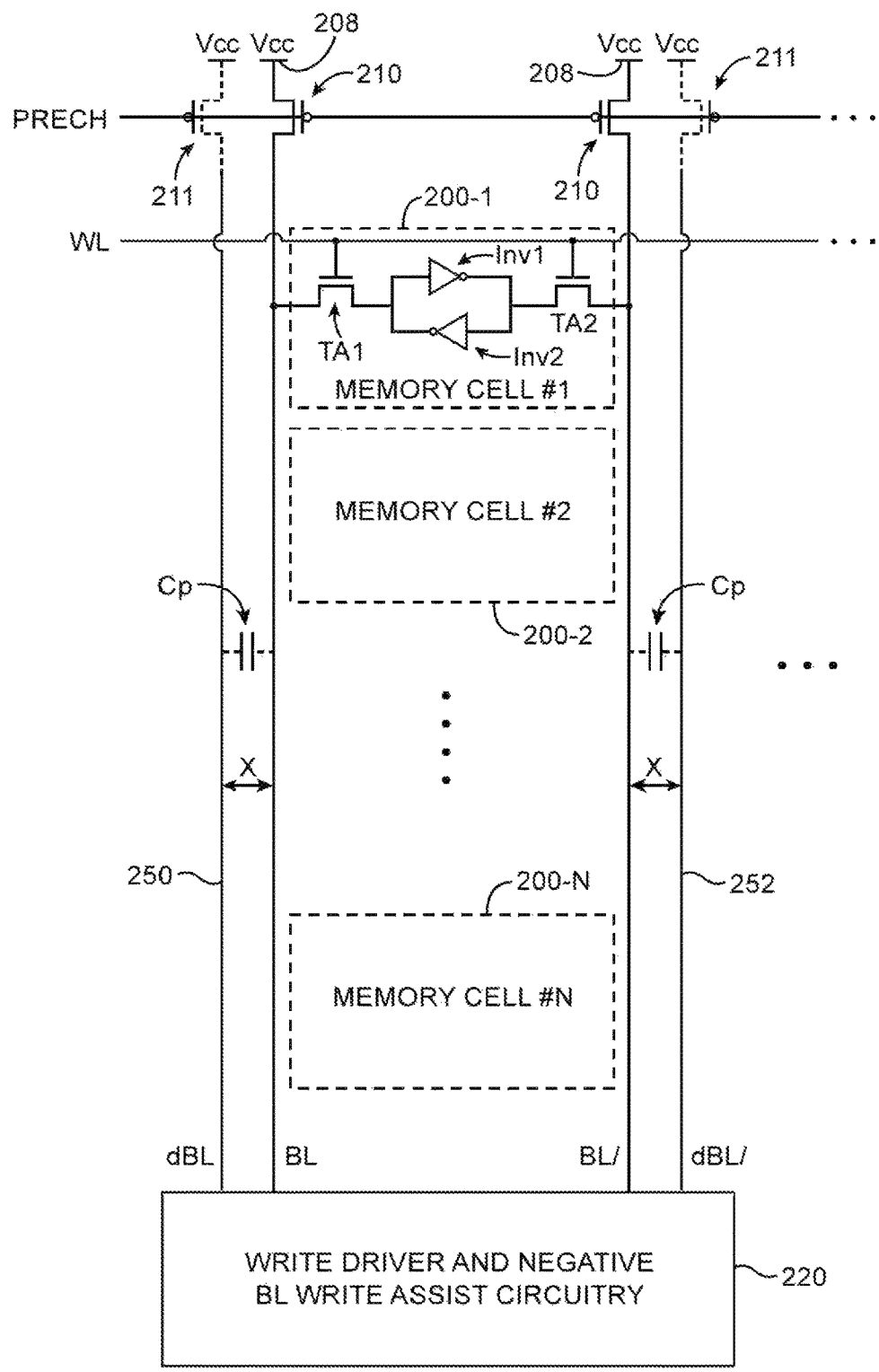
FIG. 2 is a diagram of an illustrative column of memory cells and associated dummy bit line structures in accordance with an embodiment.

In accordance with an embodiment, an improved negative bit line write assist scheme is provided that uses dummy bit lines (sometimes referred to as dummy data lines) to provide the necessary bit line capacitance while exhibiting reduced variability. FIG. 2 is a circuit diagram showing one suitable arrangement of a column of memory cells with improved write margin.

As shown in FIG. 2, the column may include a first memory cell 200-1, a second memory cell 200-2, . . . , and an $N^{th}$ memory cell 200-N. The storage portion of each memory cell 200 may include cross-coupled inverting circuits such as circuits Inv1 and Inv2 each of which has an input and an output. In particular, the input of circuit Inv1 may be coupled to the output of circuit Inv2, whereas the input of Inv2 may be coupled to the output of circuit Inv1. The output of circuit Inv2 may serve as a first internal data storage node for cell 200 while the output of circuit Inv1 may serve as a second internal data storage node for cell 200. The storage portion of memory cell 200 configured in this way may be used to store a single bit of data (e.g., the first and second internal data storage nodes may store true and complement versions of a single data bit, respectively).

The storage portion of memory cell 200 may be coupled to access transistors (sometimes referred to as memory "address" transistors or memory "pass gate" transistors) such as transistors TA1 and TA2 to perform write and/or read operations. In the example of FIG. 2, access transistor TA1 may be coupled between a first data line (e.g., a true bit line on which true bit line signal BL is conveyed) and the first internal data storage node, whereas access transistor TA2 may be coupled between a second data line (e.g., a complementary bit line on which complement bit line signal BL/ is conveyed) and the second internal data storage node. Transistors TA1 and TA2 may each have a gate that is coupled to a word line on which word line signal WL is conveyed.

The example of FIG. 2 in which memory cell 200 is implemented using the 6-transistor (6T) configuration is merely illustrative and does not serve to limit the scope of the present invention. In general, memory cell 200 may be implemented in an 8T configuration with a separate read port, may be implemented in a 10T configuration with improved soft-error upset immunity, may include less than six transistors, may include more than 10 transistors, or may be implemented using any other suitable memory architecture.

Still referring to FIG. 2, the true and complementary bit lines may be coupled to a positive power supply line 208 (e.g., a power supply line on which positive power supply voltage Vcc is provided) via precharge transistors 210. In particular, precharge transistors 210 may have a source terminal that is coupled to power supply line 208, a drain terminal that is coupled to the bit lines, and a gate terminal that receives a bit line precharge control signal PRECH. Configured in this way, the bit line voltages can be precharged to Vcc by asserting PRECH (e.g., by driving PRECH low).

The true and complementary bit lines may also be coupled to column circuitry such as write driver and negative bit line write assist circuitry 220. The column of memory cells may also include read circuitry, address circuitry, multiplexing circuitry, and/or other control circuitry which are not shown in FIG. 2 in order not to unnecessarily obscure the present invention.

In accordance with an embodiment, write assist circuitry 220 may be used to drive one or more dummy bit lines. For example, write assist circuitry 220 may be configured to drive a first dummy bit line 250 (e.g., a first dummy bit line on which first dummy bit line voltage dBL is conveyed) that is associated with the true bit line and may also be configured to drive a second dummy bit line 252 (e.g., a second dummy bit line on which second dummy bit line voltage dBL/ is conveyed) that is associated with the complementary bit line. The actual/active true and complementary data lines may be directly coupled to memory cells 200, whereas the dummy bit lines 250 and 252 are not directly coupled to memory cells 200 (e.g., the dummy bit lines are not physically coupled to the access transistors in the memory cells 200). The dummy bit lines are optionally coupled to precharge transistors 211. In such scenarios, only a selected one of the dummy bit lines is precharged following a write operation to help reduce dynamic power.

In particular, first dummy bit line 250 may be formed adjacent to and run parallel with the true bit line, whereas the second dummy bit line 252 may be formed adjacent to and run parallel with the complementary bit line. Arranged in this way, a parasitic capacitance Cp is formed between the each pair of dummy bit line and actual data line. Parasitic capacitance Cp may serve as a booster capacitor that is instrumental in providing the desired negative bit line write assist.

The parasitic capacitance Cp can be changed by adjusting the distance X that separates the dummy bit line from the associated data line. In general, the dummy bit line should be placed as close to the associated data line as possible to maximize the parasitic capacitance and reduce routing footprint. The dummy bit lines and the data line may be formed on the same metal routing layer or different metal routing layers in the dielectric stack. If desired, the length of the dummy bit lines may also be adjusted to control Cp.

Figure 3:
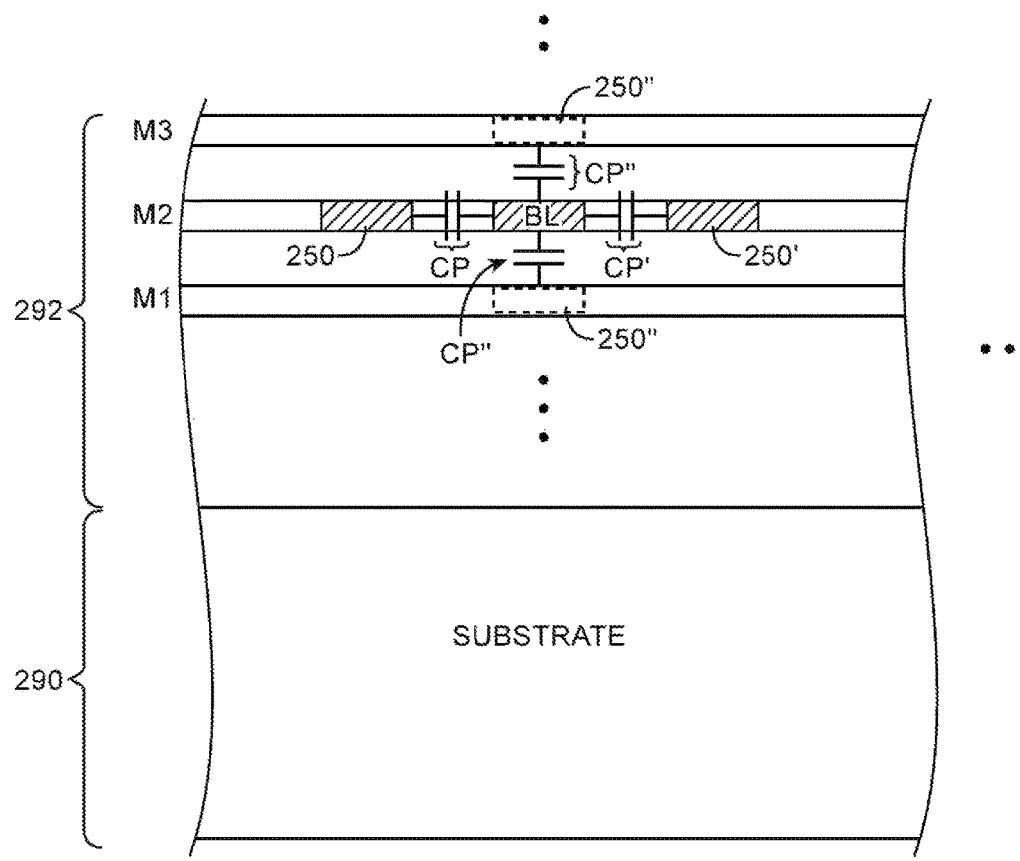
FIG. 3 is a cross-sectional side view showing how more than one dummy bit line can be formed to help increase dummy coupling capacitance in accordance with an embodiment.

FIG. 3 is a cross-sectional side view showing how more than one dummy bit line can be formed adjacent to a single active bit line to help increase the dummy parasitic coupling capacitance. As shown in FIG. 3, a dielectric stack 292 may be formed on a semiconductor substrate 290. The dielectric stack 292 may include alternating metal routing layers and via layers. In the example of FIG. 3, the active bit line may be formed in the metal-2 (M2) metal routing layer. To further increase the parasitic capacitance, dummy bit lines such as dummy lines 250 and 250' may be formed on both sides of the active bit line in metal routing layer M2, thus providing parasitic capacitance Cp and Cp', respectively. If desired, dummy bit lines may also be formed above and/or below the active bit line in metal layers M3 and M1, respectively, as indicated by optional dummy bit lines 250" (e.g., to help provide additional parasitic capacitance Cp").

Implementing negative bit line booster capacitance in this way does not incur any area penalty. The capacitance provided by dummy bit lines also exhibit substantially reduced variations across PVT compared to that of conventional MOS capacitors (e.g., the capacitance between neighboring metal routing lines is much more controlled than the capacitance across a gate oxide layer).

Figure 6:
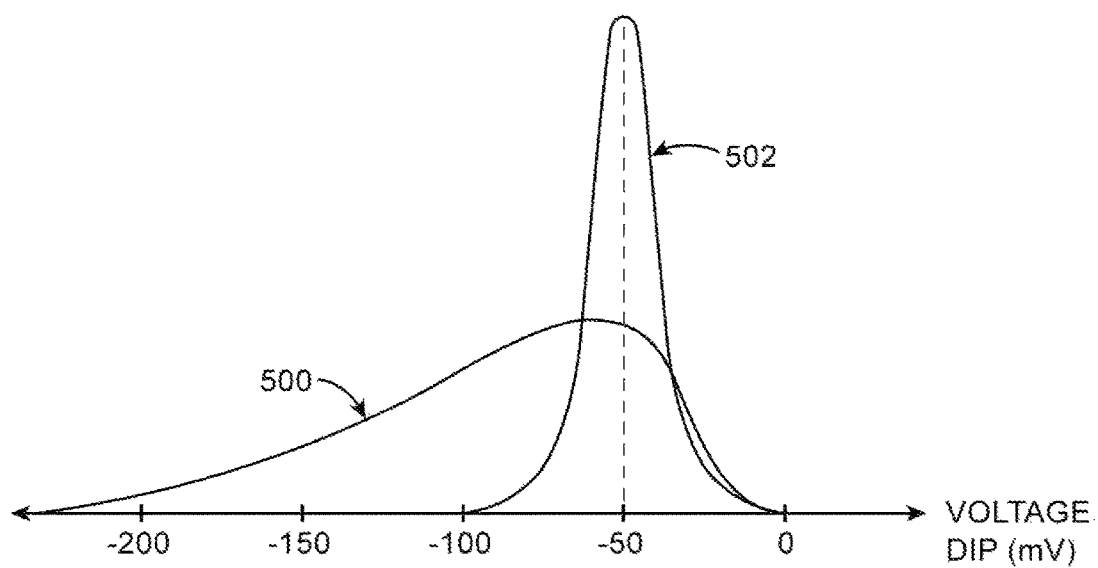
FIG. 6 shows probability density function plots illustrating how a write assist scheme based on dummy bit lines exhibits reduced variability compared to a conventional write assist scheme based on metal-oxide-semiconductor devices in accordance with an embodiment.

This is shown in FIG. 6, which compares a probability density function (PDF) plot 500 that is associated with the use of MOS capacitors to generate negative bit line voltages with a probability density function (PDF) plot 502 that is associated with the use of dummy bit lines to generate negative bit line voltages. As shown in FIG. 6, PDF 500 exhibits a much wider spread (indicating that the negative bit line voltage can vary widely from −25 mV to −300 mV or more), whereas PDF 502 exhibits a much tighter distribution (indicating that the negative bit line voltage only varies slightly around the target negative bit line voltage of −50 mV).

The amount of parasitic capacitance provided by the dummy bit lines also automatically scales with respect to the number of memory cells in the column (e.g., as more memory cells are added to the column, the data lines and the corresponding dummy bit lines are both lengthened, thereby increasingly Cp proportionally). Write assist techniques that employ dummy bit lines therefore offer improved device reliability without incurring any area overhead.

Figure 4:
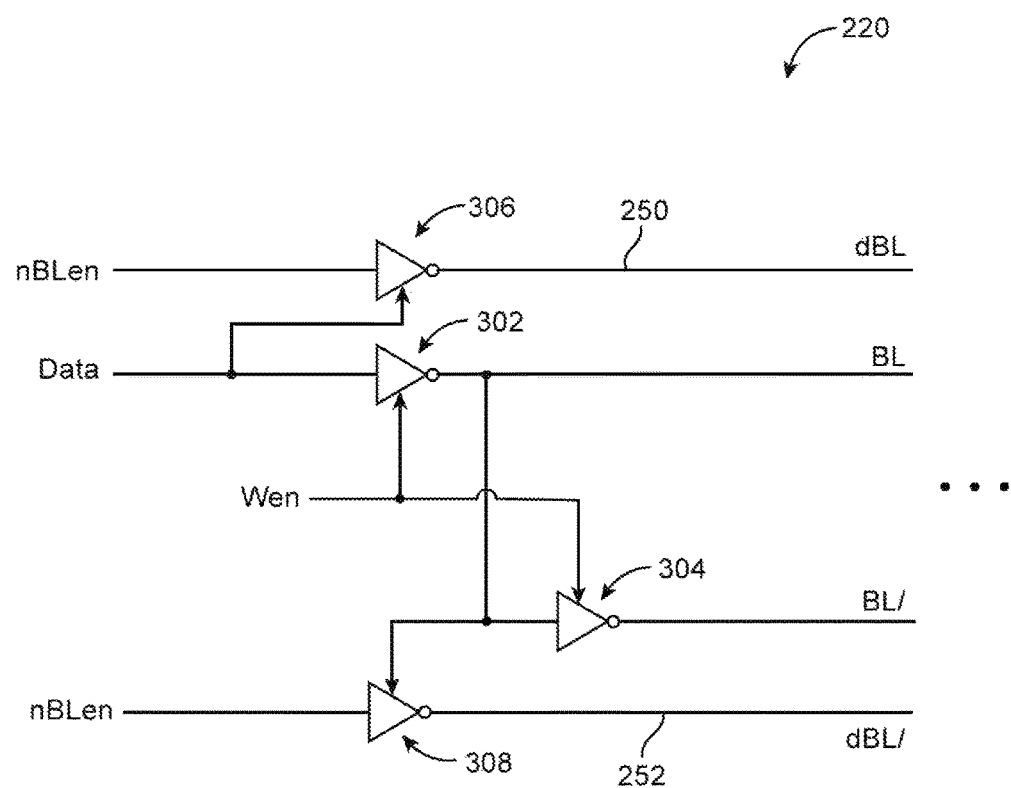
FIG. 4 is a circuit diagram of illustrative write driver and negative bit line write assist circuitry in accordance with an embodiment.

FIG. 4 is a circuit diagram of write driver and negative bit line write assist circuitry 220. As shown in FIG. 4, circuitry 220 may include at least a first inverting circuit 302, a second inverting circuit 304, a third inverting circuit 306, and a fourth inverting circuit 308. Each of inverting circuits 302, 304, 306, and 308 may be tri-state inverters (e.g., inverters that can be placed in an active driving mode and an inactive tri-state high impedance mode).

Tri-state inverter 302 may have an input that receives a data signal, an output that drives the true bit line, and a control input that receives a write enable signal Wen. Tri-state inverter 304 may have an input that is coupled to the output of inverter 302, an output that drives the complementary bit line, and a control input that receives the write enable signal Wen. Coupled in this way, inverters 302 and 304 may actively drive the true and complementary data lines when Wen is asserted or may be placed in tri-state mode when Wen is deasserted.

Tri-state inverter 306 may have an input that receives a negative bit line enable signal nBLen, an output that selectively drives the first dummy bit line 250, and a control input that receives the data signal. Tri-state inverter 308 may have an input that receives signal nBLen, an output at selectively drives the second dummy bit line 252, and a control input that receives an inverted version of the Data signal (i.e., a control input that is coupled to the output of inverter 302). Connected in this way, inverter 306 may actively drive dummy bit line 250 when signal Data is asserted and may be placed in tri-state mode when signal Data is deasserted. Similarly, inverter 308 may actively drive dummy bit line 252 when the inverted version of signal Data is asserted and may be placed in tri-state mode when the inverted version of signal Data is deasserted. In other words, only one of inverters 306 and 308 can be activated at any given point in time. In certain embodiments, an inverted version of nBLen (see, e.g., ~nBLen in FIG. 5) may serve as the write enable signal for selectively activating inverters 302 and 304.

The write driver and negative bit line write assist circuitry 220 of FIG. 4 is merely illustrative. Other suitable ways of implementing a negative bit line voltage triggering circuit (e.g., using other types of logic gates) can be used.

Figure 5:
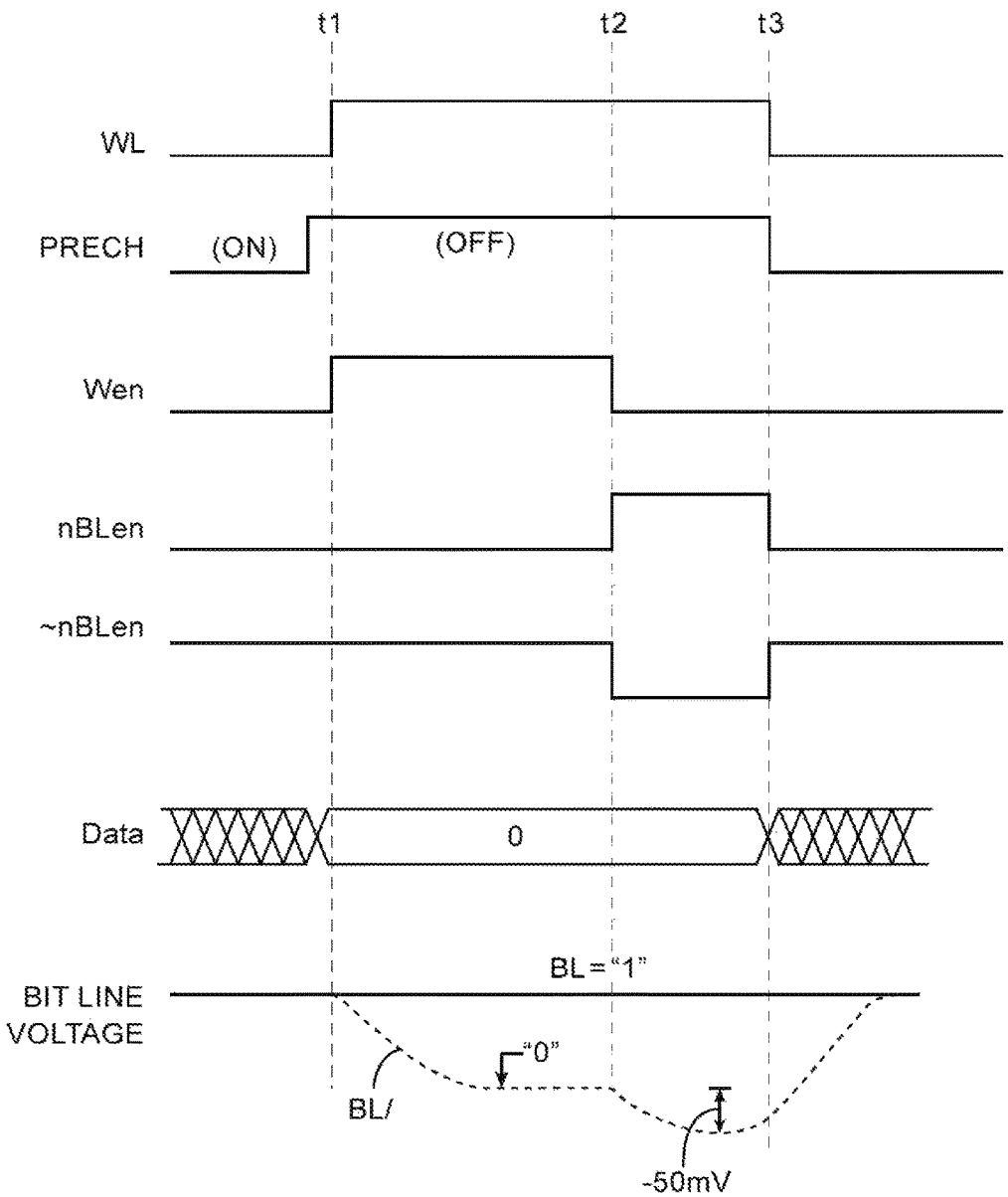
FIG. 5 is a timing diagram illustrating the operation of the write driver and negative bit line write assist circuitry of the type shown in FIG. 4 in accordance with an embodiment.

FIG. 5 is a timing diagram that illustrates the operation of write assist circuitry 220 of the type described in connection with FIG. 4. Prior to time t1, the precharge signal PRECH may be deasserted to turn off the precharge pull-up transistors (e.g., to deactivate transistors 210 in FIG. 2). At this point in time, both true bit line voltage BL and complement bit line voltage BL/ are precharged high.

At time t1, word line signal WL and write enable signal Wen may be asserted, and Data may be driven to a logic "0". Asserting signal WL will turn on the access transistors in a selected memory cell. By asserting Wen, inverter 302 will serve to keep BL high at logic "1" while inverter 304 will serve to drive BL/ towards ground (i.e., logic "0").

At time t2, write enable signal Wen may be deasserted and negative bit line enable signal nBLen may be pulsed high. Since Data is "0", inverter 308 will be activated, whereas inverter 306 is placed in tri-state mode. When nBLen is driven high, inverter 308 will drive the voltage on the corresponding dummy bit line 252 (i.e., dBL/) low. When voltage dBL/ is driven low, a corresponding voltage drop will be coupled onto the second data line via the parasitic capacitance Cp that is interposed between dummy bit line 252 and the second data line, thereby pushing BL/ temporarily to a negative voltage level. Signal BL/ can be driven further below logic "0" because signal Wen has been disabled, which allows the true and complement data lines to float.

At time t3, signals WL and nBLen are deasserted while signal PRECH is asserted to precharge the true and complementary bit lines. This causes BL/ to charge up back towards logic "1". If desired, only the selected dummy bit line is precharged during data line settling (after time t3) to help further reduce dynamic power.

In the example of FIG. 5, BL/ is driven to −50 mV, which effectively overdrives the access transistor and helps to improve write performance. The example of FIG. 5 in which BL/ is driven to a negative voltage level is merely illustrative. In other scenarios (i.e., when Data is "1"), BL may be driven to the negative voltage level while BL/ remains high.

In general, the parasitic capacitance Cp may be tuned so that the desired negative bit line voltage level is coupled onto the actual bit lines(s). For example, a larger parasitic capacitance may be implemented to increase the negative bit line voltage droop, whereas a smaller parasitic capacitance may be implemented to reduce the negative bit line voltage droop. If desired, the negative bit line voltage on the true and complementary bit lines may be equal to −10 mV, −20 mV, −30 mV, −40 mV, −50 mV, −60 mV, or other suitable negative voltage levels.

The steps of FIG. 5 are merely illustrative and the existing steps may be modified or omitted, additional steps may be added, and the order of certain steps may be altered.

The foregoing is merely illustrative of the principles of this invention and various modifications can be made by those skilled in the art. The foregoing embodiments may be implemented individually or in any combination.

Although the invention has been described in some detail for the purposes of clarity, it will be apparent that certain changes and modifications can be practiced within the scope of the appended claims. Although some of the appended claims are single dependent only or reference only some of their preceding claims, their respective feature(s) can be combined with the feature(s) of any other claim.

What is claimed is:

1. Memory circuitry, comprising
   a memory cell;
   a bit line that is directly coupled to the memory cell;
   a dummy bit line that is adjacent to the bit line and that runs parallel to the bit line, wherein the dummy bit line is not directly coupled to the memory cell; and
   an additional dummy bit line that is adjacent to the bit line and that runs parallel to the bit line.

2. The memory circuitry defined in claim 1, further comprising:
   write driver and negative bit line write assist circuitry that is coupled to the bit line and the dummy bit line.

3. The memory circuitry defined in claim 2, wherein the write driver and negative bit line write assist circuitry includes a plurality of tri-state inverting circuits.

4. The memory circuitry defined in claim 3, wherein a first tri-state inverting circuit in the plurality of tri-state inverting circuits has an input that receives a negative bit line enable signal and an output that is coupled to the dummy bit line.

5. The memory circuitry defined in claim 4, wherein a second tri-state inverting circuit in the plurality of tri-state inverting circuits has an input that receives a data signal and an output that is coupled to the bit line.

6. The memory circuitry defined in claim 5, further comprising:
   an additional bit line that is directly coupled to the memory cell; and
   a second dummy bit line that is adjacent to the additional bit line and that runs parallel to the additional bit line, wherein the second dummy bit line is not directly coupled to the memory cell.

7. The memory circuitry defined in claim 6, wherein a third tri-state inverting circuit in the plurality of tri-state inverting circuits has an input that receives the negative bit line enable signal and an output that is coupled to the additional dummy bit line.

8. The memory circuitry defined in claim 7, wherein a fourth tri-state inverting circuit in the plurality of tri-state inverting circuits has an input that receives an inverted version of the data signal and an output that is coupled to the additional bit line.

9. A method of operating memory circuitry, comprising:
   asserting a word line signal to access a selected memory cell during a write operation;

while the word line signal is asserted, driving a bit line voltage on a bit line towards zero volts during the write operation;

while the word line signal is asserted, driving a voltage on a dummy bit line towards zero volts to further reduce the bit line voltage below zero volts during the write operation;

asserting a write enable signal during the write operation; and deasserting the write enable signal during the write operation, wherein driving the voltage on the dummy bit line towards zero volts comprises driving the voltage on the dummy bit line towards zero volts after the write enable signal has been deasserted during the write operation.

10. The method defined in claim 9, wherein driving the bit line voltage towards zero volts comprises using a write driver to drive the bit line voltage towards zero volts.

11. The method defined in claim 10, wherein driving the voltage on the dummy bit line towards zero volts comprises driving the voltage on the dummy bit line towards zero volts only when the write driver is deactivated.

12. The method defined in claim 9, wherein the selected memory cell is coupled to another bit line, the method further comprising:

while the word line is asserted, allowing another dummy bit line that is associated with the another bit line to float.

13. An integrated circuit, comprising:
a memory cell;
a first active data line that is coupled to the memory cell;
a second active data line that is coupled to the memory cell;
a first dummy data line that runs parallel to the first active data line;
a second dummy data line that runs parallel to the second active data line, wherein a first parasitic capacitance that is interposed between the first active data line and the first dummy data line is adapted to couple a negative data line voltage level onto the first active data line during write operations, and wherein a second parasitic capacitance that is interposed between the second active data line and the second dummy data line is adapted to couple a negative data line voltage level onto the second active data line during the write operations; and
precharge circuitry that is coupled to both the first and second dummy data lines and that precharges at most one of the first and second dummy data lines at any given point in time.

14. The integrated circuit defined in claim 13, wherein the first and second dummy data lines are not directly coupled to any memory cell on the integrated circuit.

15. The integrated circuit defined in claim 13, wherein the first active data line and the first dummy data line have substantially equal lengths.

16. The integrated circuit defined in claim 13, wherein the first active data line and the first dummy data line are formed in a common metal routing layer.

17. The integrated circuit defined in claim 13, further comprising:

write driver and negative data line write assist circuitry that includes tri-state inverters for driving the first and second active data lines and for driving the first and second dummy data lines.

* * * * *